(12) United States Patent
Lee et al.

(10) Patent No.: US 7,821,017 B2
(45) Date of Patent: Oct. 26, 2010

(54) LIGHT-EMITTING DIODE AND METHOD FOR FABRICATING THE SAME

(75) Inventors: Chi-Shen Lee, Taipei (TW); Su-Hui Lin, Taichung (TW)

(73) Assignee: HUGA Optotech Inc., Taichung (TW)

( * ) Notice: Subject to any disclaimer, the term of this patent is extended or adjusted under 35 U.S.C. 154(b) by 0 days.

(21) Appl. No.: 12/426,471

(22) Filed: Apr. 20, 2009

(65) Prior Publication Data

US 2010/0140629 A1    Jun. 10, 2010

(30) Foreign Application Priority Data

Dec. 4, 2008    (TW)    ............................. 97147142 A

(51) Int. Cl.
*H01L 29/167* (2006.01)
(52) U.S. Cl. .................. 257/86; 438/44; 438/46; 257/E21.108
(58) Field of Classification Search .............. 438/44, 438/46; 257/86, E21.108
See application file for complete search history.

(56) References Cited

U.S. PATENT DOCUMENTS

| | | | |
|---|---|---|---|
| 6,030,849 A * | 2/2000 | Hasegawa et al. | 438/46 |
| 6,342,404 B1 * | 1/2002 | Shibata et al. | 438/46 |
| 6,806,115 B2 * | 10/2004 | Koide et al. | 438/44 |
| 2009/0103583 A1 * | 4/2009 | Tanaka et al. | 372/45.01 |
| 2009/0173965 A1 * | 7/2009 | Shim et al. | 257/103 |

* cited by examiner

*Primary Examiner*—Trung Dang
(74) *Attorney, Agent, or Firm*—Jianq Chyun IP Office

(57) ABSTRACT

The invention discloses a method for fabricating a light-emitting diode. In an embodiment of the invention, the method comprises the following steps of (a) preparing a substrate; (b) forming an epitaxial layer on the substrate, wherein the epitaxial layer has an upper surface; (c) forming a mask layer on a first region of the upper surface of the epitaxial layer; (d) forming a semiconductor multi-layer structure on a second region of the upper surface of the epitaxial layer, wherein the second region is distinct from the first region; (e) removing the mask layer formed on the first region of the upper surface of the epitaxial layer; and (f) forming an electrode on the first region of the upper surface of the epitaxial layer.

12 Claims, 6 Drawing Sheets

LIGHT-EMITTING DIODE AND METHOD FOR FABRICATING THE SAME

BACKGROUND OF THE INVENTION

1. Field of the Invention

The present invention relates generally to a light-emitting diode and a method for fabricating the same, and more particularly, the present invention relates to a method for easy fabrication and cost saving.

2. Description of the Prior Art

Nowadays light-emitting diodes are broadly applied to various products such as key systems, back-light modules of mobile phones, lighting systems of vehicles, light bulbs for decorations, and remote controls, etc. Please refer to FIG. 1A to FIG. 1C. FIG. 1A to FIG. 1C illustrate a method for fabricating a conventional light-emitting diode.

As illustrated in FIG. 1A, after preparing the substrate 10, an N-type gallium nitride layer 11, a lighting layer 12 and a P-type gallium nitride layer 13 are formed on the substrate 10 in turn according to the conventional fabricating method.

Subsequently, as illustrated in FIG. 1B, an inductively coupled plasma (ICP) reactive ion etching process is performed in the method to partly etch the P-type gallium nitride layer 13, the lighting layer 12 and the N-type gallium nitride layer 11 to make a part of the N-type gallium nitride layer 11 uncovered.

After that, as illustrated in FIG. 1C, an electrode 14 is formed on the uncovered part of the N-type gallium nitride layer 11 and an electrode 15 is formed on the P-type gallium nitride layer 13 in the method. The purpose is to conduct the P-type gallium nitride layer 13 and the N-type gallium nitride layer 11 to make the light-emitting diode working. However, the disadvantage of the conventional fabrication method is that the ICP etching process not only makes the whole process of fabricating a light-emitting diode more complex but also increases the cost.

SUMMARY OF THE INVENTION

Accordingly, an aspect of the present invention is to provide a method for fabricating a light-emitting diode. According to an embodiment of the invention, the fabricating method comprises the following steps.

Firstly, a substrate is prepared. Secondly, an epitaxial layer is formed on the substrate. The epitaxial layer has an upper surface, and the upper surface comprises a first region and a second region distinct from the first region. Subsequently, a mask layer is formed on the first region. Then a semiconductor multi-layer structure is formed on the second region, wherein the semiconductor multi-layer structure has a lighting layer. Afterwards the mask layer formed on the first region is removed. Then an electrode is formed on the first region of the upper surface of the epitaxial layer.

According to another embodiment of the invention, the fabricating method comprises the following steps.

Firstly, a substrate is prepared. Secondly, an epitaxial layer is formed on the substrate. The epitaxial layer has an upper surface, and the upper surface comprises a first region and a second region distinct from the first region. Subsequently, a mask layer is formed on the first region. Then a semiconductor multi-layer structure is formed on the second region, wherein the semiconductor multi-layer structure has a lighting layer. Afterwards, a part of the mask layer is selectively etched to make a part of the first region uncovered. Then an electrode is formed on the uncovered region of the first region.

Another aspect of the present invention is to provide a light-emitting diode. According to an embodiment of the invention, the light-emitting diode comprises a substrate, an epitaxial layer, a mask layer, a semiconductor multi-layer structure, a first electrode, and a second electrode.

The epitaxial layer is formed on the substrate and has an upper surface, and the upper surface comprises a first region and a second region distinct from the first region. The mask layer is formed on a part of the first region to make a part of the first region uncovered. The semiconductor multi-layer structure is formed on the second region and comprises a lighting layer. The first electrode is formed on the uncovered region of the first region, and the second electrode is formed on the semiconductor multi-layer structure.

The objective of the present invention will no doubt become obvious to those of ordinary skill in the art after reading the following detailed description of the preferred embodiment, which is illustrated in the various figures and drawings.

BRIEF DESCRIPTION OF THE APPENDED DRAWINGS

DETAILED DESCRIPTION OF THE INVENTION

Please refer to FIG. 2A to FIG. 2G. FIG. 2A to FIG. 2G illustrate a method for fabricating a light-emitting diode according to an embodiment of the invention.

Figure 1A:
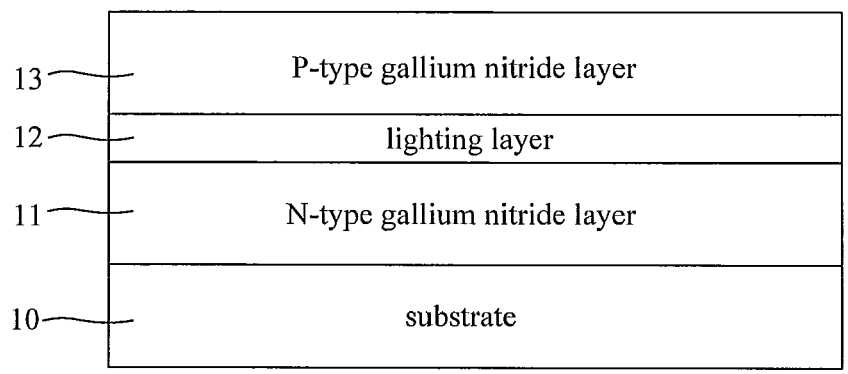
FIG. 1A to FIG. 1C illustrate a method for fabricating a conventional light-emitting diode.
Figure 1B:
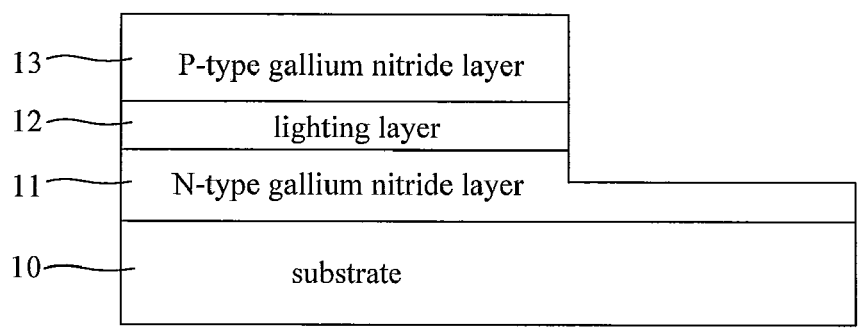
Figure 1C:
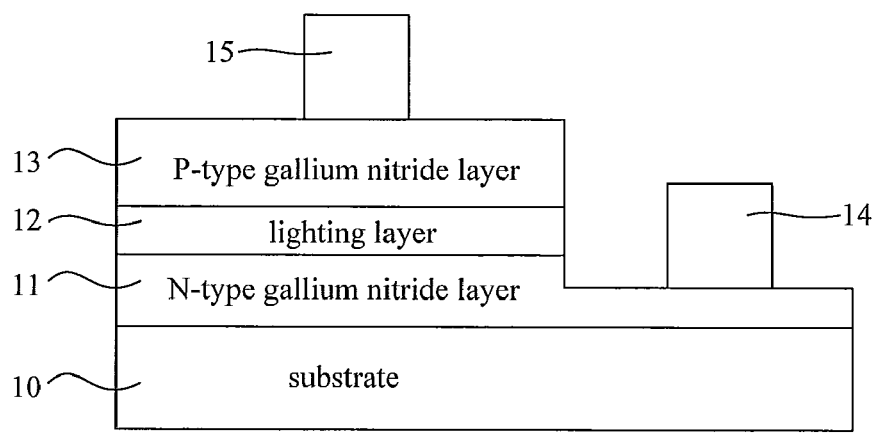
Figure 2A:
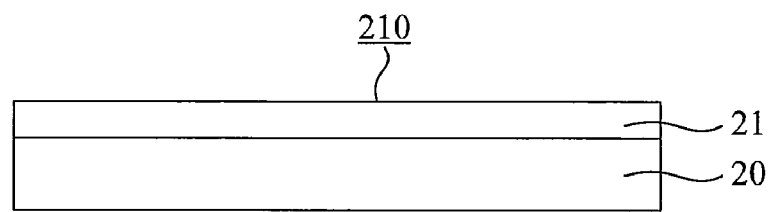
FIG. 2A to FIG. 2G illustrate a method for fabricating a light-emitting diode according to an embodiment of the invention.

Firstly, as illustrated in FIG. 2A, a substrate 20 is prepared and an epitaxial layer 21 is then formed on the substrate 20. Practically, the substrate 20 could be made of, but not limited to, glass (silicon dioxide), silicon, germanium, gallium nitride, gallium arsenide, gallium phosphide, aluminum nitride, sapphire, spinnel, silicon carbide, zinc oxide, magnesium oxide, lithium aluminum dioxide, lithium gallium dioxide, or magnesium aluminum oxide. In an embodiment, the substrate 20 could be made of sapphire and the epitaxial layer 21 could be made of gallium nitride.

Figure 2B:
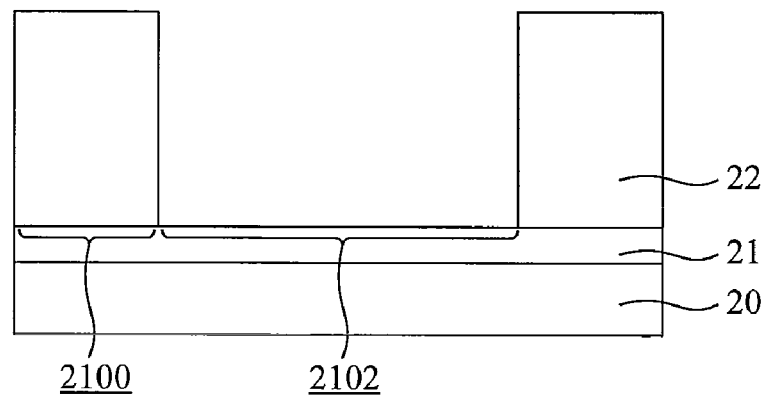

The epitaxial layer 21 has an upper surface 210, and the upper surface 210 comprises a first region and a second region distinct from the first region. Subsequently, a mask layer is formed on the first region. Practically, the mask layer could be made of a thermo-tolerant material such as silicon dioxide or other similar oxides. As illustrated in FIG. 2B, a silicon dioxide mask layer 22 is formed on the first region 2100 in the method.

Figure 2C:
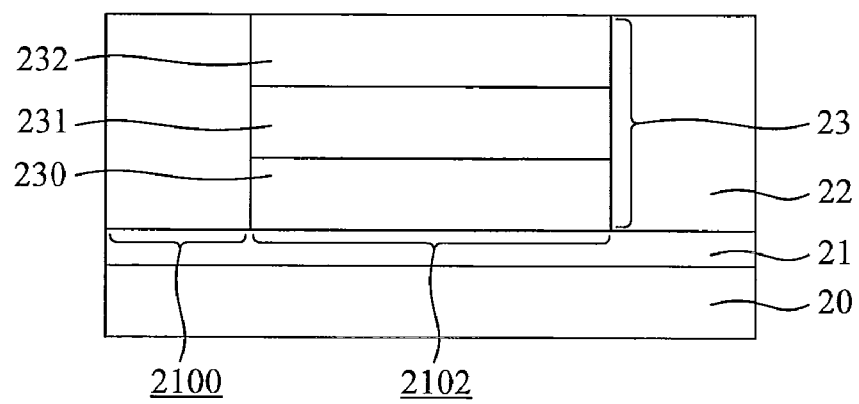

Then, as illustrated in FIG. 2C, a semiconductor multi-layer structure 23 is formed on a second region 2102. Practically, the semiconductor multi-layer structure 23 could comprise an N-type gallium nitride layer 230, a lighting layer 231 and a P-type gallium nitride layer 232, and the thickness of the semiconductor multi-layer structure 23 could be about 0.6 µm~1.2 µm. It should be noted that the height of the mask layer 22 is substantially the same as that of the semiconductor multi-layer structure 23.

Owing to the gallium nitride is not easily grown on the silicon dioxide mask layer 22, which is well-know to those of ordinary skill in the art, and the thickness of the silicon dioxide mask layer 22 is considerable, the gallium nitride semiconductor multi-layer structure 23 could be restrictedly grown on the second region 2102 by means of the silicon dioxide mask layer 22.

Furthermore, the extension of internal defects (e.g. dislocations) generated from the growth of a gallium nitride material could be eliminated by the silicon dioxide mask layer 22. Thereby, the quality of the epitxial light-emitting diode could be increased. The internal quantum efficiency of the light-emitting diode and the light extraction efficiency are thus improved.

Figure 2D:
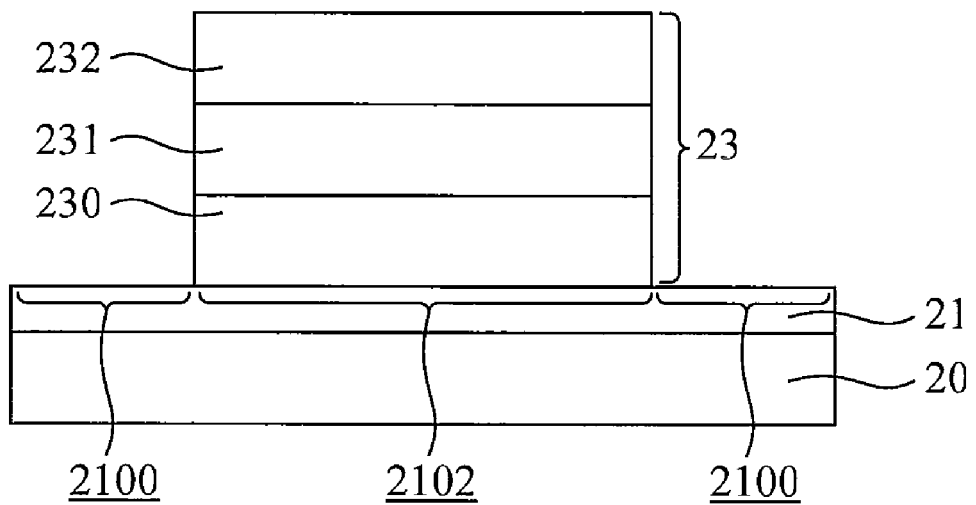

After the semiconductor multi-layer structure 23 is formed, the mask layer 22 formed on the first region 2100 is removed in the method as illustrated in FIG. 2D. Practically, the mask layer mentioned above could be removed by means of a chemical. For example, the silicon dioxide mask layer 22 could be removed by an acid chemical. The composition of the acid chemical is well-known to those of ordinary skill in the art, so the details are not described here.

Figure 2E:
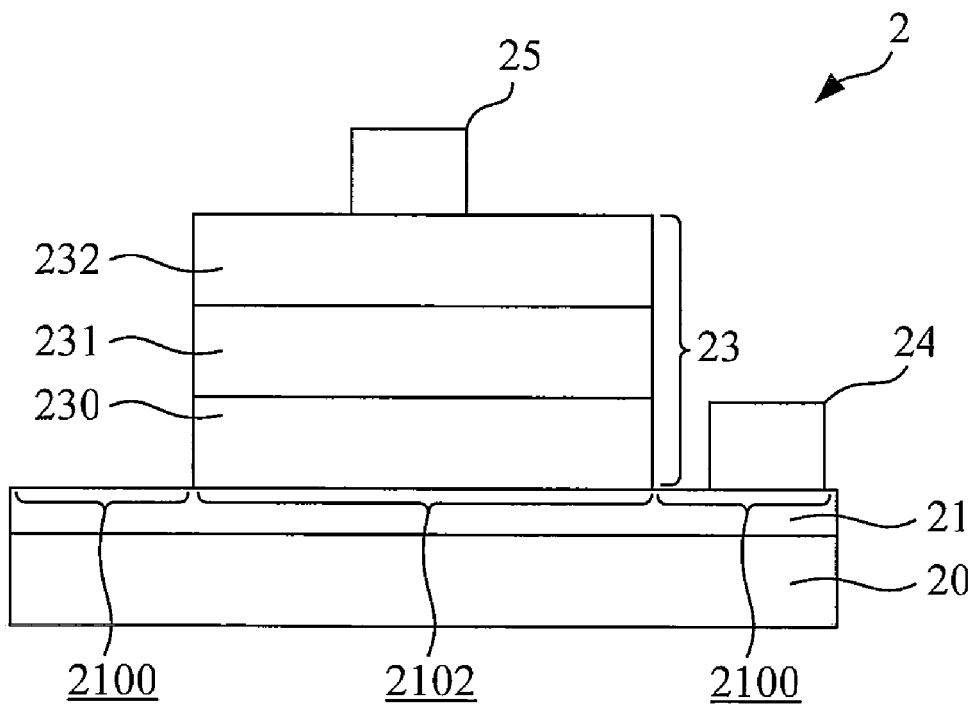

Subsequently, as illustrated in FIG. 2E, an N-type electrode 24 is formed on the first region 2100 of the upper surface of the epitaxial layer 21 and a P-type electrode 25 is formed on the P-type gallium nitride layer 232 of the semiconductor multi-layer structure 23 in the method to complete fabricating the light emitting diode 2. It should be noted that if the semiconductor multi-layer structure 23 comprises a transparent conducting layer which could be made of indium tin oxide (ITO), the P-type electrode 25 could be formed on the transparent conducting layer in the method.

More particularly, in a conventional fabricating method, an ICP etching process should be performed before forming an N-type electrode on a light-emitting diode. But in the method of the present invention, it is not necessary to perform the ICP etching process before forming an N-type electrode 24, so that the cost could be saved. Moreover, the ICP etching process for semiconductor multi-layer structure 23 is excluded in the method of this invention and the semiconductor multi-layer structure 23 could be restrictedly grown on the second region 2102 by means of the mask layer 22, so that the side wall of the semiconductor multi-layer structure 23 could avoid being damaged and the complete outline could be conserved.

Figure 2F:
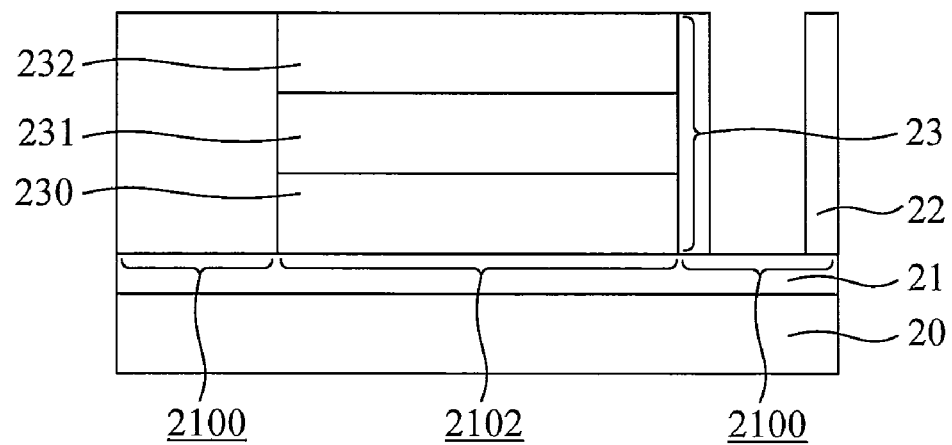

In another embodiment, after forming the semiconductor multi-layer structure 23 on the second region 2102 (as illustrated in FIG. 2C), a part of the mask layer 22 could be selectively etched in the method to make a part of the first region 2100 uncovered as illustrated in FIG. 2F.

Figure 2G:
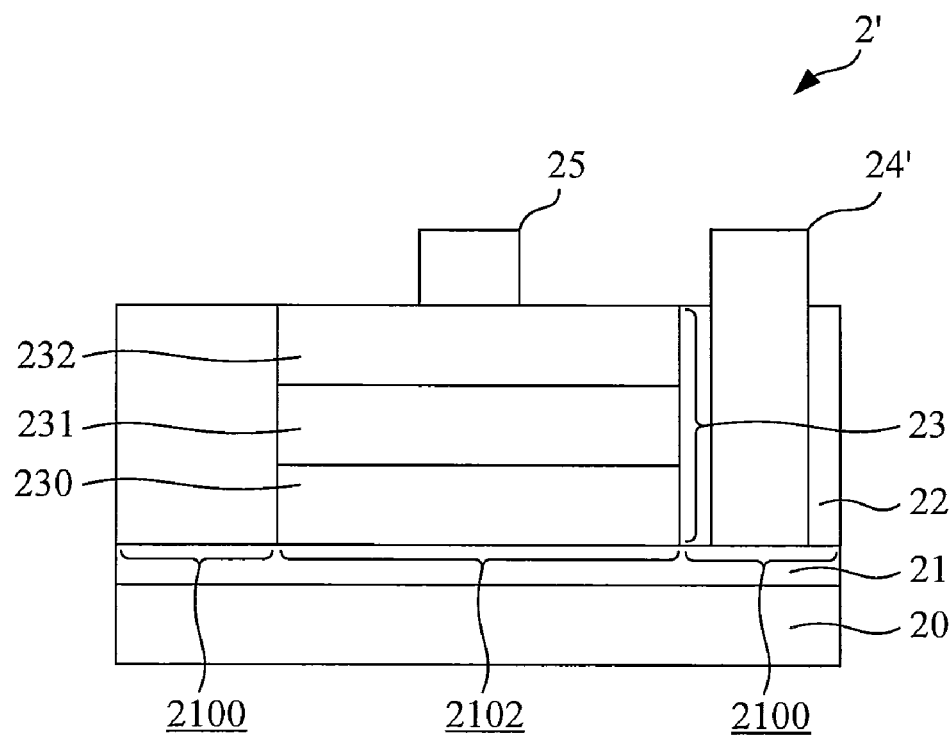

Subsequently, as illustrated in FIG. 2G, an N-type electrode 24' is formed on the uncovered region of the first region 2100, and a P-type electrode 25 is formed on the P-type gallium nitride layer 232 of the semiconductor multi-layer structure 23 in the method to complete fabricating the light emitting diode 2'.

In an embodiment, the height of the N-type electrode 24' is substantially the same as that of the P-type electrode 25. Thereby while packaging the light emitting diode 2', the wire bonding process of the electrode could be excluded.

Please refer to FIG. 3A to FIG. 3F. FIG. 3A to FIG. 3F illustrate a method for fabricating a light-emitting diode according to another embodiment of the invention.

Figure 3A:
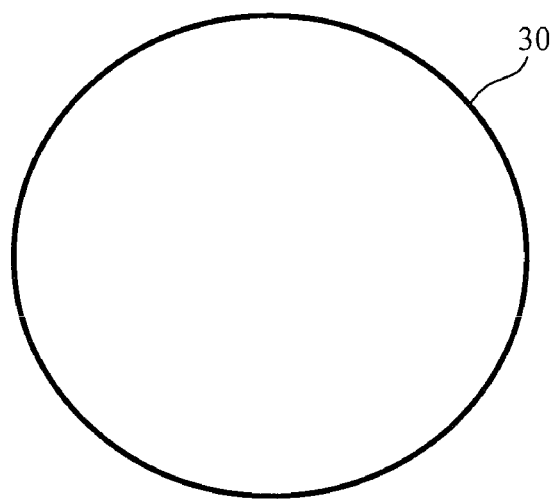
FIG. 3A to FIG. 3F illustrate a method for fabricating a light-emitting diode according to another embodiment of the invention.

As illustrated in FIG. 3A, a wafer 30 is firstly prepared. Practically, the wafer 30 could be made of, but not limited to, glass, silicon, germanium, gallium nitride, gallium arsenide, gallium phosphide, aluminum nitride, sapphire, spinnel, silicon carbide, zinc oxide, magnesium oxide, lithium aluminum dioxide, lithium gallium dioxide, or magnesium aluminum oxide. It should be noted that the wafer 30 has an upper surface.

Figure 3B:
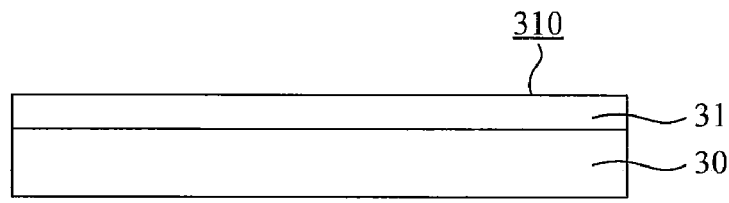

Afterwards, as illustrated in FIG. 3B, an epitaxial layer 31 is formed on the upper surface of the wafer 30, and the epitaxial layer 31 has an upper surface 310, and the upper surface 310 thereon defines a plurality of predetermined scribe lines (not shown in the figure). In an embodiment, the wafer 30 could be made of sapphire and the epitaxial layer 31 could be made of gallium nitride.

Figure 3C:
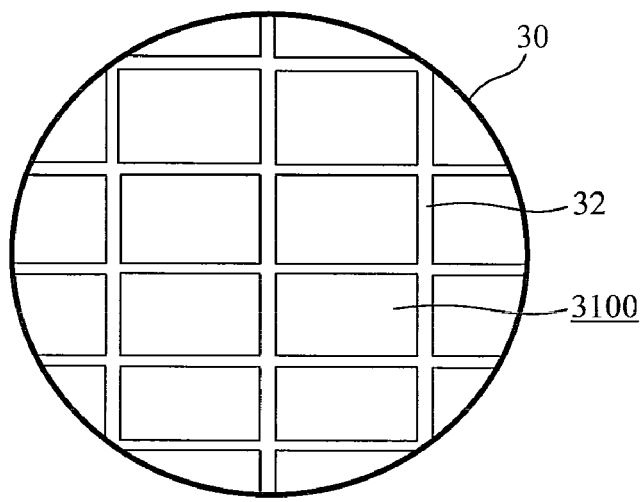

Subsequently, as illustrated in FIG. 3C, a mask layer 32 is formed on a first region of the upper surface 310 of the epitaxial layer 31, wherein the position of the first region locates on the plurality of scribe lines substantially, and the upper surface 310 of the epitaxial layer 31 could be divided into a plurality of second regions 3100 after the mask layer 32 is formed. Practically, the mask layer 32 could be made of a thermo-tolerant material such as silicon dioxide.

Figure 3D:
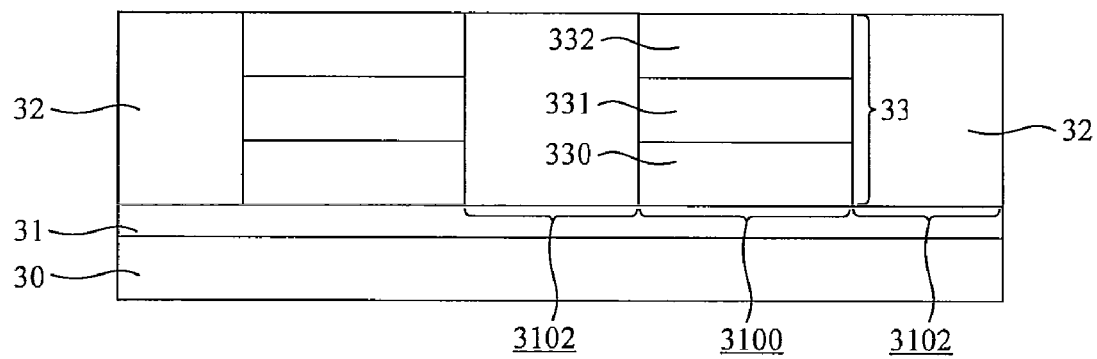

Then, as illustrated in FIG. 3D, a plurality of semiconductor multi-layer structures 33 is formed on the plurality of second region 3100. Practically, each of the semiconductor multi-layer structures 33 could comprise an N-type gallium nitride layer 330, a lighting layer 331 and a P-type gallium nitride layer 332. It should be noted that the height of the mask layer 32 is substantially the same as that of the semiconductor multi-layer structure 33.

Figure 3E:
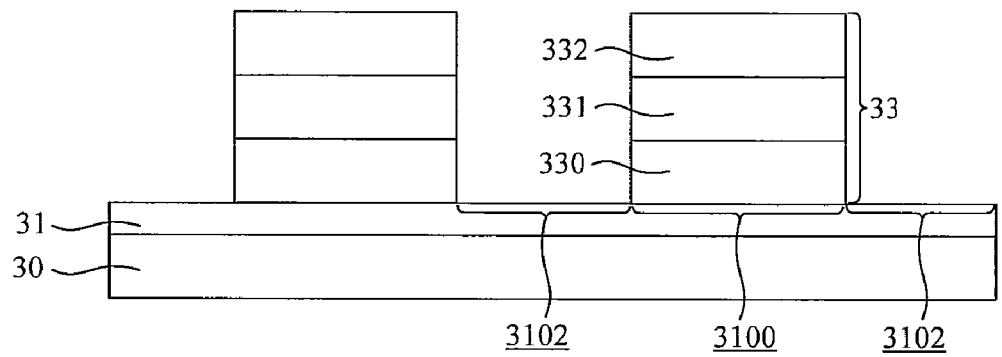

Afterwards, the mask layer 32 formed on the first region 3102 is removed in the method as illustrated in FIG. 3E. Practically, the mask layer mentioned above could be removed by means of a chemical. For example, the silicon dioxide mask layer could be removed by an acid chemical.

Figure 3F:
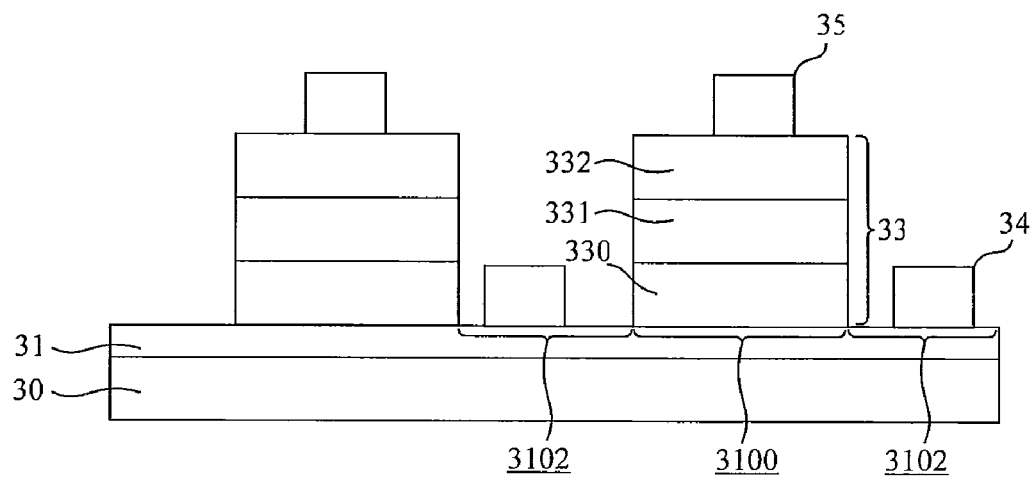

Subsequently, as illustrated in FIG. 3F, a plurality of electrode 34 is formed on the first region 3102 of the upper surface of the epitaxial layer 31, wherein each of the electrodes 34 is corresponding to one of the semiconductor multi-layer structures 33. Furthermore, an electrode 35 is formed on each of the P-type gallium nitride layer 332 of the semiconductor multi-layer structure 33 in the method. It should be noted that if the semiconductor multi-layer structures 33 comprise a transparent conducting layer which could be made of indium tin oxide (ITO), the electrode 25 could be formed on the transparent conducting layers in the method. Finally, the wafer is scribed along the scribe lines and a plurality of completely fabricated light-emitting diodes is thus achieved.

To summarize, the method for fabricating a light-emitting diode in the invention has easy fabrication and cost saving advantages. Particularly, the extension of dislocations generated from the growth of a light-emitting diode could be eliminated by the silicon dioxide mask layer. Accordingly, the internal quantum efficiency of the light-emitting diode and the light extraction efficiency are thus improved.

Although the present invention has been illustrated and described with reference to the preferred embodiment thereof, it should be understood that it is in no way limited to the details of such embodiment but is capable of numerous modifications within the scope of the appended claims.

What is claimed is:

1. A method of fabricating a light-emitting diode comprising the following steps:

(a) preparing a substrate;

(b) forming an epitaxial layer on the substrate, the epitaxial layer having an upper surface, and the upper surface comprising a first region and a second region distinct from the first region;

(c) forming a mask layer on the first region;

(d) forming a semiconductor multi-layer structure on the second region, and the semiconductor multi-layer structure comprising a lighting layer;

(e) removing the mask layer formed on the first region; and (f) forming a first electrode on the first region of the upper surface of the epitaxial layer, wherein the height of the mask layer is substantially the same as that of the semiconductor multi-layer structure.

2. The method of claim 1 further comprising the following step:

(g) forming a second electrode on the semiconductor multi-layer structure.

3. The method of claim 1, wherein the mask layer in step (e) is removed by a chemical agent.

4. The method of claim 1, wherein the mask layer is made of silicon dioxide.

5. A method of fabricating a light-emitting diode comprising the following steps:

(a) preparing a substrate;

(b) forming an epitaxial layer on the substrate, the epitaxial layer having an upper surface, and the upper surface comprising a first region and a second region distinct from the first region;

(c) forming a mask layer on the first region;

(d) forming a semiconductor multi-layer structure on the second region, and the semiconductor multi-layer structure comprising a lighting layer;

(e) selectively etching a part of the mask layer to make a part of the first region uncovered; and (f) forming a first electrode on the uncovered region of the first region.

6. The method of claim 5 further comprising the following step:

(g) forming a second electrode on the semiconductor multi-layer structure.

7. The method of claim 6, wherein the height of the first electrode is substantially the same as that of the second electrode.

8. The method of claim 5, wherein the mask layer is made of silicon dioxide.

9. A light-emitting diode comprising:

a substrate;

an epitaxial layer formed on the substrate, the epitaxial layer having an upper surface, and the upper surface comprising a first region and a second region distinct from the first region;

a mask layer formed on a part of the first region to make a part of the first region uncovered;

a semiconductor multi-layer structure formed on the second region, and the semiconductor multi-layer structure comprising a lighting layer;

a first electrode formed on the uncovered region of the first region; and a second electrode formed on the semiconductor multi-layer structure.

10. The light-emitting diode of claim 9, wherein the height of the mask layer is substantially the same as that of the semiconductor multi-layer structure.

11. The light-emitting diode of claim 9, wherein the mask layer is made of silicon dioxide.

12. The light-emitting diode of claim 9, wherein the height of the first electrode is substantially the same as that of the second electrode.

* * * * *